United States Patent
Otsubo et al.

(10) Patent No.: US 10,342,116 B2
(45) Date of Patent: Jul. 2, 2019

(54) HIGH-FREQUENCY MODULE

(71) Applicant: Murata Manufacturing Co., Ltd., Kyoto (JP)

(72) Inventors: Yoshihito Otsubo, Kyoto (JP); Yoshihisa Masuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/916,534

(22) Filed: Mar. 9, 2018

(65) Prior Publication Data

US 2018/0199428 A1  Jul. 12, 2018

Related U.S. Application Data

(63) Continuation of application No. PCT/JP2016/076586, filed on Sep. 9, 2016.

(30) Foreign Application Priority Data

Sep. 11, 2015 (JP) .................................. 2015-179615

(51) Int. Cl.
*H05K 5/00* (2006.01)
*H05K 7/00* (2006.01)
(Continued)

(52) U.S. Cl.
CPC ........... *H05K 1/0243* (2013.01); *H01L 23/28* (2013.01); *H01L 23/552* (2013.01); *H01L 23/66* (2013.01);
(Continued)

(58) Field of Classification Search
CPC ................................ H05K 3/284; H05K 5/065
(Continued)

(56) References Cited

U.S. PATENT DOCUMENTS

2010/0195291 A1\* 8/2010 Kimura et al. ...... H05K 1/0218
361/748
2014/0146495 A1 5/2014 Fisher, Jr. et al.
(Continued)

FOREIGN PATENT DOCUMENTS

JP           5622906 B1     11/2014
JP       2015-053297 A       3/2015
(Continued)

OTHER PUBLICATIONS

International Search Report for International Application No. PCT/JP2016/076586, dated Nov. 29, 2016.
(Continued)

*Primary Examiner* — Binh B Tran
(74) *Attorney, Agent, or Firm* — Pearne & Gordon LLP

(57) ABSTRACT

A high-frequency module includes a wiring board; a plurality of components mounted on an upper surface of the wiring board; a sealing resin layer that is stacked on the upper surface of the wiring board and that has a step; a groove that is formed in the sealing resin layer to intersect with the step when the wiring board is viewed in plan view, and that extends between predetermined components; and a shield wall disposed in the groove and formed with a conductor. The groove includes a first portion at an upper surface side of the wiring board and a second portion at an upper surface side of the sealing resin layer, the second portion being continuous from the first portion. An area of the second portion is larger than an area of the second portion.

9 Claims, 5 Drawing Sheets

(51) Int. Cl.
| | |
|---|---|
| *H05K 1/18* | (2006.01) |
| *H05K 1/02* | (2006.01) |
| *H01L 23/28* | (2006.01) |
| *H01L 25/04* | (2014.01) |
| *H05K 9/00* | (2006.01) |
| *H01L 23/552* | (2006.01) |
| *H01L 23/66* | (2006.01) |
| *H05K 3/28* | (2006.01) |
| *H01L 25/18* | (2006.01) |
| *H01L 23/31* | (2006.01) |
| *H01L 25/16* | (2006.01) |

(52) U.S. Cl.
CPC ........... *H01L 25/04* (2013.01); *H05K 1/0216* (2013.01); *H05K 1/0224* (2013.01); *H05K 9/0015* (2013.01); *H01L 23/3121* (2013.01); *H01L 25/16* (2013.01); *H01L 25/18* (2013.01); *H01L 2224/16225* (2013.01); *H01L 2924/181* (2013.01); *H01L 2924/1815* (2013.01); *H01L 2924/19105* (2013.01); *H05K 3/284* (2013.01); *H05K 2201/0715* (2013.01); *H05K 2203/1316* (2013.01)

(58) Field of Classification Search
USPC ....... 361/760, 761, 762, 765, 777, 799, 800, 361/818
See application file for complete search history.

(56) References Cited

U.S. PATENT DOCUMENTS

| | | |
|---|---|---|
| 2015/0043172 A1 | 2/2015 | Mugiya et al. |
| 2015/0044822 A1 | 2/2015 | Mugiya et al. |
| 2015/0049439 A1* | 2/2015 | Shimamura et al. ........ H05K 1/0216 361/728 |
| 2015/0062835 A1 | 3/2015 | Kai et al. |

FOREIGN PATENT DOCUMENTS

| | | |
|---|---|---|
| JP | 2015-057804 A | 3/2015 |
| JP | 2015-072935 A | 4/2015 |

OTHER PUBLICATIONS

Written Opinion for International Application No. PCT/JP2016/076586, dated Nov. 29, 2016.

* cited by examiner

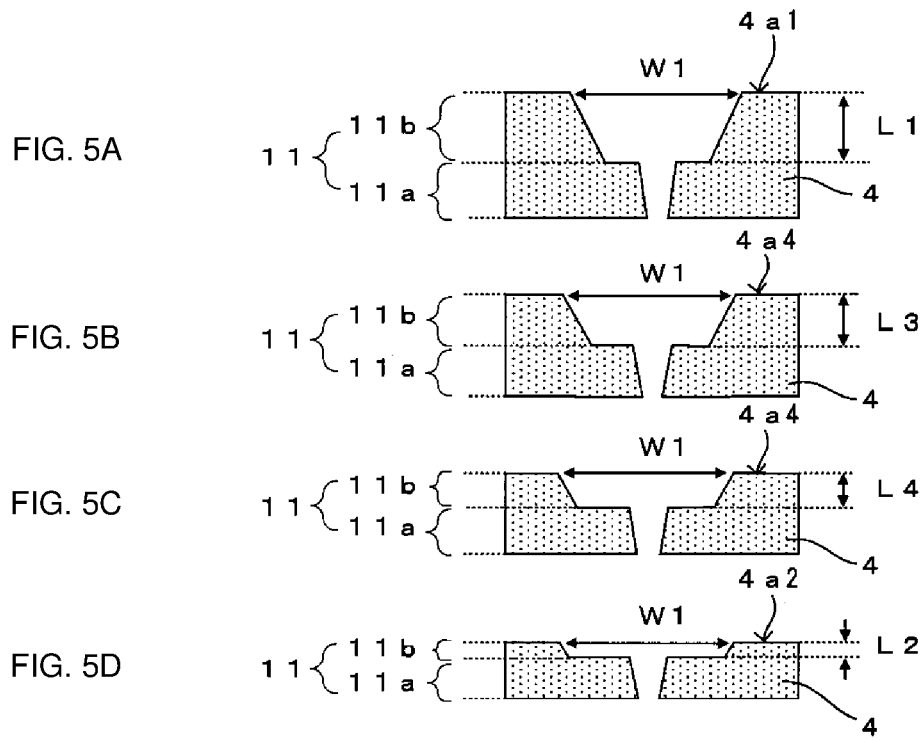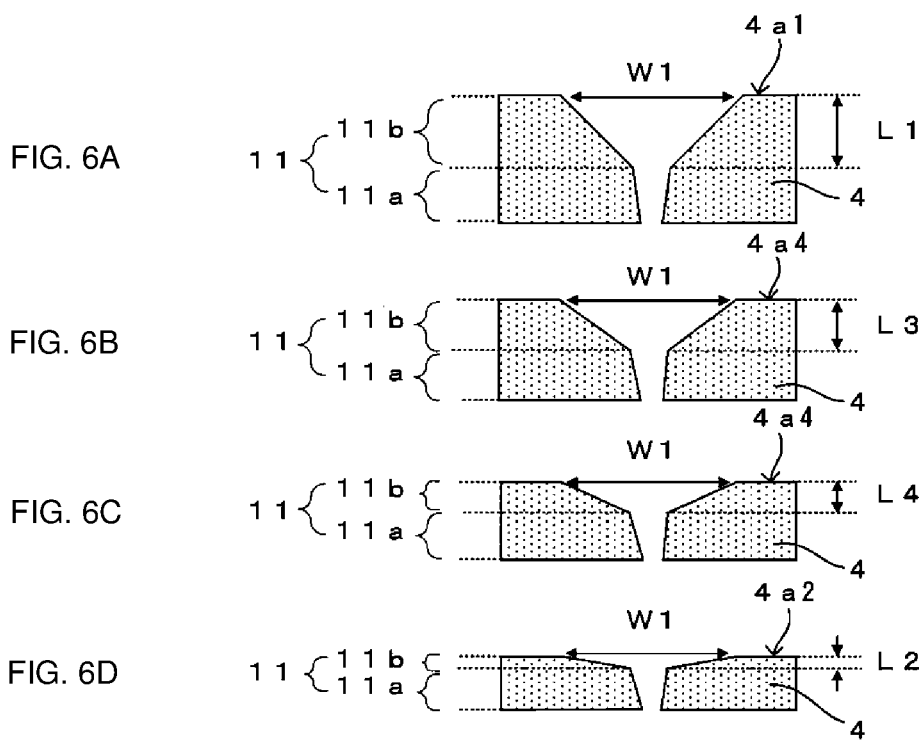

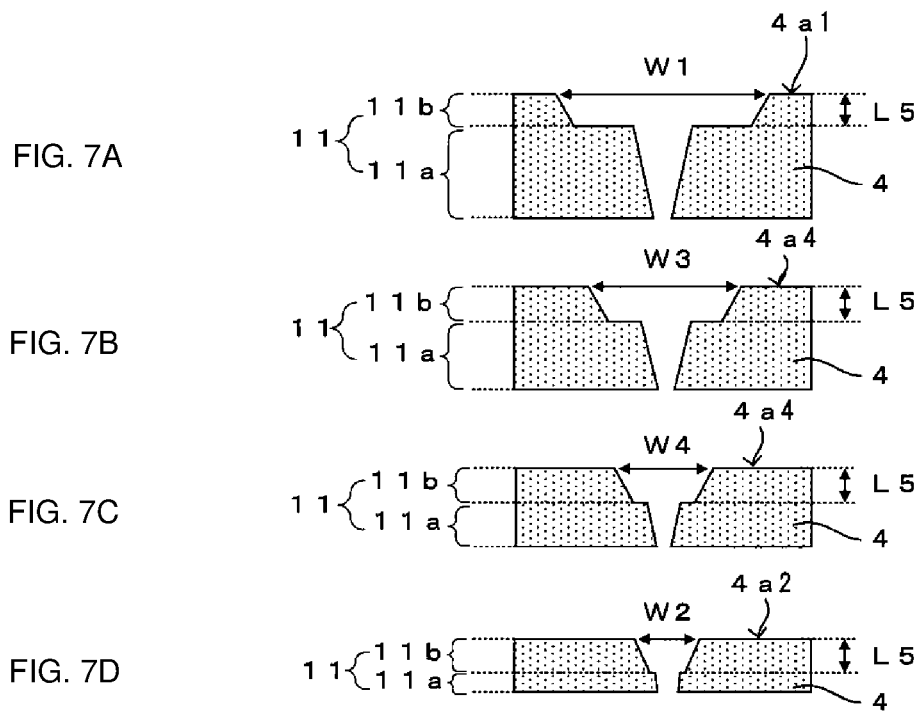
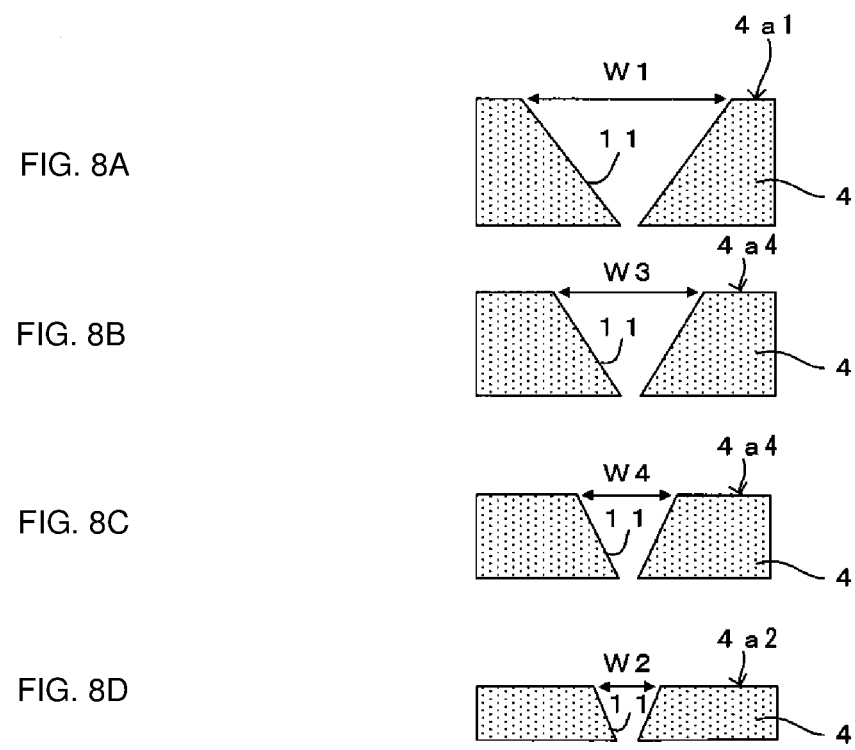

HIGH-FREQUENCY MODULE

This is a continuation of International Application No. PCT/JP2016/076586 filed on Sep. 9, 2016 which claims priority from Japanese Patent Application No. 2015-179615 filed on Sep. 11, 2015. The contents of these applications are incorporated herein by reference in their entireties.

BACKGROUND

Technical Field

The present disclosure relates to a high-frequency module including a sealing resin layer that covers a plurality of components mounted on a wiring board, and a shield wall for preventing interference of noises between the components.

A high-frequency module that is mounted on a mobile terminal device or the like may include a shield layer for cutting electromagnetic waves. High-frequency modules of this type may include a high-frequency module in which a component mounted on a wiring board is covered with a sealing resin and a shield layer is provided to cover the surface of the sealing resin.

The shield layer is provided for cutting noises from the outside. If a plurality of components is mounted on the wiring board, noises generated from the components may interfere with another component. Owing to this, in related art, a high-frequency module provided with a shield for cutting the noises from the outside and the noises between the mounted components has been suggested.

For example, as illustrated in FIG. 9, in a high-frequency module 100 described in Patent Document 1, a plurality of components 102 are mounted on a wiring board 101, and the components 102 are covered with a sealing resin layer 103. A trench 104 (groove) is formed at an upper surface of the sealing resin layer 103. The trench 104 extends between predetermined components. The shield layer 105 is formed with a conductive resin that covers the surface of the sealing resin layer 103 and with which the trench 104 is filled. Also, the shield layer 105 is connected to a surface conductor 106 on the wiring board 101 at a bottom portion of the trench 104. The surface conductor 106 is electrically connected to a ground terminal of the high-frequency module 100.

With this configuration, the conductive resin that covers the surface of the sealing resin layer 103 can cut the noises from the outside to the components 102. Also, the conductive resin with which the trench 104 is filled can prevent the interference of the noises between the predetermined components.

Patent Document 1: Japanese Patent No. 5622906 (see paragraphs [0030] to [0040], FIG. 4)

BRIEF SUMMARY

With the high-frequency module 100 of related art, since the surface of the sealing resin layer 103 is flat, for example, if the components 102 mounted on the wiring board 101 have different thicknesses, an excessive portion of the sealing resin layer 103 is formed on one of the components 102 having a smaller thickness. To decrease such an excessive portion and to downsize the high-frequency module 100, the inventors are studying a reduction in size by changing the thickness of the sealing resin layer 103 in accordance with the thicknesses of the components 102. However, if the thickness of the sealing resin layer 103 is changed, a step is formed at the surface. If the trench 104 for shielding extends across the step, it may be difficult to fill the trench 104 with the conductive paste evenly at both the higher portion side and the lower portion side and to eliminate a region not filled with the paste.

The present disclosure is made in light of the above-described situations, and in a high-frequency module having a step formed at a surface of a sealing resin layer, when a groove for shielding extends across the step in the sealing resin layer, the present disclosure increases ease of filling the groove with a conductive paste.

A high-frequency module according to the present disclosure includes a wiring board; a plurality of components mounted on a principal surface of the wiring board; a sealing resin layer that is stacked on the principal surface of the wiring board, that has a step at an opposite surface of the sealing resin layer opposite to a surface of the sealing resin layer at a principal surface side of the wiring board, and that covers the plurality of components; a groove that is formed in the sealing resin layer to intersect with the step when the wiring board is viewed in plan view (in a direction perpendicular to the principal surface of the wiring board), and that extends between a predetermined component and another component included in the plurality of components; and a shield wall disposed in the groove and formed with a conductor. The groove includes, in a cross section taken in a direction perpendicular to the principal surface of the wiring board and in a direction intersecting with the groove, a first portion at the principal surface side of the wiring board, and a second portion at an opposite surface side of the sealing resin layer, the second portion being continuous from the first portion. In the cross section, an area of the second portion of the groove located at a higher portion side of the step is larger than an area of the second portion of the groove located at a lower portion side of the step.

With the configuration, a portion (second portion) of the groove at the higher portion side of the step at the opposite surface side of the sealing resin layer has a larger filling capacity for the conductive paste than that of the groove at the lower portion side of the step. That is, the area of a paste filling opening or an opening of the groove, though a groove usually could not be easily filled up with a conductive paste as described in the Background Art, at the higher portion side of the step can be larger than that of the groove at the low place side, the second portion can be easily filled with the paste, and hence ease of filling a portion (first portion) at the principal surface side of the wiring board with the paste can be increased. The connection portion between the shield wall and the wiring board may have a constant width. In this case, the mount area for the components of the wiring board is not decreased.

Also, a length in a depth direction (a direction perpendicular to the principal surface of the wiring board) of the groove at the higher portion side of the step may be larger than a length in the direction at the lower portion side, and hence the area of the second portion at the higher portion side of the step may be larger than the area of the second portion at the lower portion side. In this case, when the area of the second portion of the groove at the higher portion side of the step is changed from that at the low place side, the width of the groove does not have to be changed.

Also, a width at a height position of the opposite surface of the sealing resin layer at the higher portion side of the step may be larger than a width at the height position at the lower portion side, and hence the area of the second portion at the higher portion side of the step may be larger than the area of the second portion at the lower portion side. With this configuration, the area of the second portion can be changed while the length in the depth direction of the first portion of the groove at the higher portion side of the step is not changed from that at the lower portion side.

Also, the step may have an inclined surface that connects the higher portion side with the lower portion side, and an area of the second portion at the inclined surface may be a value between the area at the higher portion side of the step and the area at the lower portion side. With this configuration, in the case where the step has the inclined surface, the ease of filling with the conductive paste can be increased over the entire length of the groove.

Also, the area of the second portion at the inclined surface may be decreased from the higher portion side of the step toward the lower portion side. With this configuration, the ease of filling a portion of the groove formed in the inclined surface with the conductive paste can be further increased.

Alternatively, a high-frequency module according to the present disclosure may include a wiring board; a plurality of components mounted on a principal surface of the wiring board; a sealing resin layer that is stacked on the principal surface of the wiring board, that has a step at an opposite surface of the sealing resin layer opposite to a surface of the sealing resin layer at a principal surface side of the wiring board, and that covers the plurality of components; a groove that is arranged in the sealing resin layer to intersect with the step when the wiring board is viewed in plan view, and that extends between a predetermined component and another component included in the plurality of components; and a shield wall disposed in the groove and formed with a conductor. The groove may have a sectional shape that is expanded from the surface of the sealing resin layer at the principal surface side of the wiring board toward the opposite surface of the sealing resin layer. An expansion degree of the sectional shape of the groove located at the higher portion side of the step may be larger than an expansion degree of the sectional shape of the groove located at the lower portion side of the step.

In this way, the ease of filling the groove with the conductive paste can be increased even by expanding the sectional shape of the groove toward the opposite surface of the sealing resin layer. Also, since the expansion degree of the sectional shape of the groove at the higher portion side of the step is larger than that at the lower portion side, the ease of filling the groove at the higher portion side with the conductive paste can be increased.

With the present disclosure, a portion (second portion) of the groove at the higher portion side of the step at the opposite surface side of the sealing resin layer has a larger filling capacity for the conductive paste than that of the groove at the lower portion side of the step. Ease of filling a portion (first portion) at the principal surface side of the wiring board can be increased at the groove at the higher portion side, which has difficulty in being filled with the conductive paste.

BRIEF DESCRIPTION OF THE SEVERAL VIEWS OF THE DRAWINGS

FIGS. 5A-5D are illustrations for explaining sectional shapes of a groove.

FIGS. 6A-6D illustrate modifications of the groove.

FIGS. 7A-7D illustrate other modifications of the groove.

FIGS. 8A-8D illustrate still other modifications of the groove.

DETAILED DESCRIPTION

First Embodiment

Figure 1:
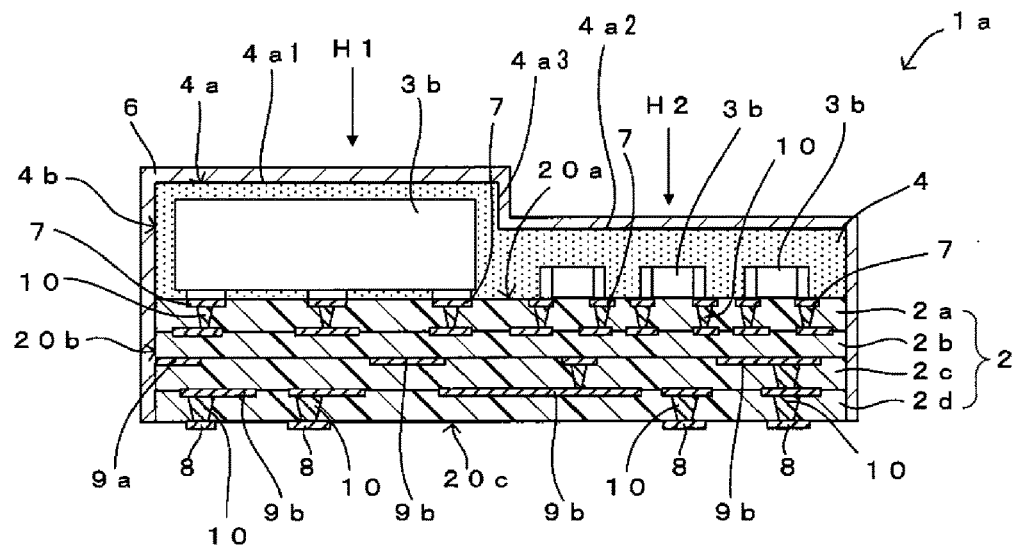
FIG. 1 is a sectional view of a high-frequency module according to a first embodiment of the present disclosure.
Figure 2:
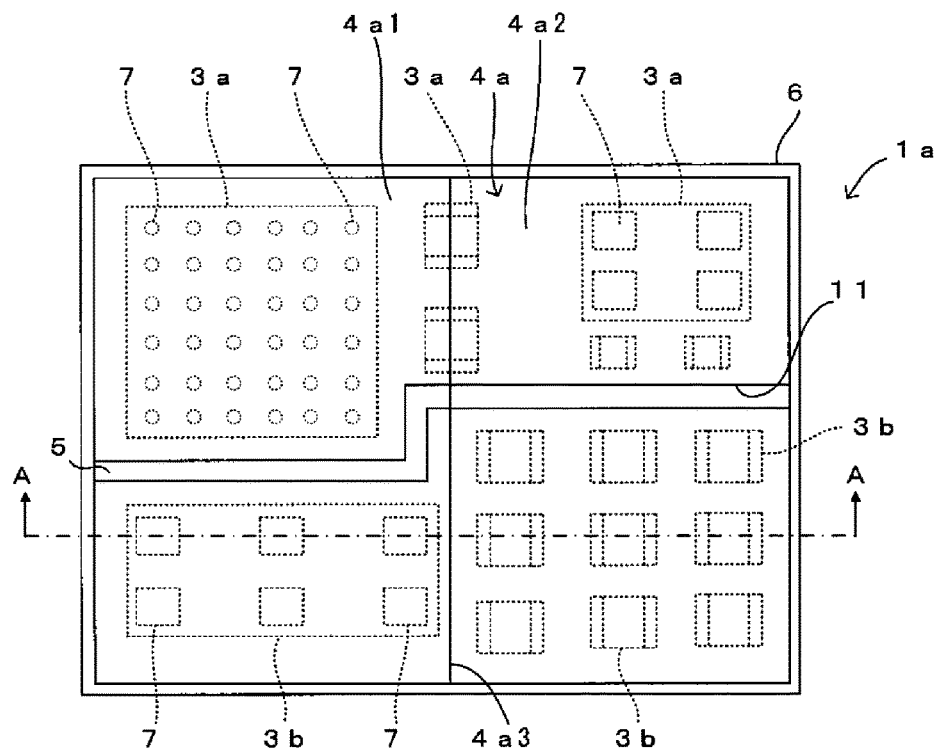
FIG. 2 is a plan view of the high-frequency module in FIG. 1.
Figure 3A:
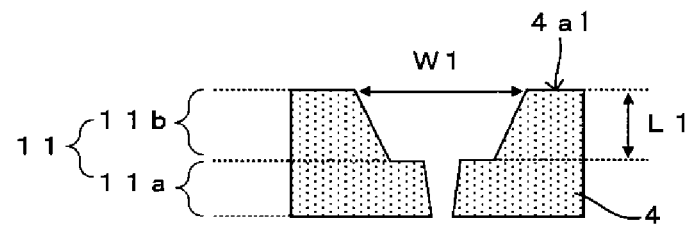
FIGS. 3A and 3B are illustrations for explaining sectional shapes of a groove.
Figure 3B:
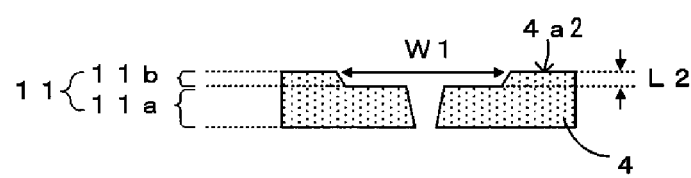

A high-frequency module according to a first embodiment of the present disclosure is described with reference to FIGS. 1 to 3B. FIG. 1 is a sectional view of the high-frequency module, FIG. 2 is a plan view of the high-frequency module, and FIGS. 3A and 3B are illustrations for explaining sectional shapes of a groove. FIG. 1 is a sectional view taken along line A-A in FIG. 2. FIG. 2 omits illustration of a shield film on an upper surface of a sealing resin layer. FIG. 3A illustrates a cross section of the groove at a higher portion side (see arrow H1 in FIG. 1) of a step. FIG. 3B illustrates a cross section of the groove at a lower portion side (see arrow H2 in FIG. 1) of the step.

As illustrated in FIGS. 1 and 2, a high-frequency module $1a$ according to this embodiment includes a wiring board 2, a plurality of components $3a$ and $3b$ mounted on an upper surface $20a$ of the wiring board 2, a sealing resin layer 4 stacked on the upper surface $20a$ of the wiring board 2, a shield film 6 that covers a surface of the sealing resin layer 4, and a shield wall 5 provided in the sealing resin layer 4. The high-frequency module $1a$ is mounted on, for example, a mother board or the like of an electronic device using high-frequency signals.

The wiring board 2 is formed, for example, by stacking a plurality of insulating layers $2a$ to $2d$ formed with low-temperature cofired ceramics or glass epoxy resin. On the upper surface $20a$ of the wiring board 2 (corresponding to "principal surface of wiring board" according to the present disclosure), mount electrodes 7 for mounting the components $3a$ and $3b$ and a surface-layer conductor (not illustrated) that is connected to the shield wall 5 are formed. On a lower surface $20c$ of the wiring board 2, outer electrodes 8 for external connection are formed. Also, in the wiring board 2, various wiring electrodes $9a$ and $9b$, and via conductors 10 are formed. The surface-layer conductor is electrically connected to ground electrodes (wiring electrodes $9a$) formed in the wiring board 2. The wiring board 2 may have a single-layer structure or a multilayer structure.

The mount electrodes 7, surface-layer conductor, outer electrodes 8, and wiring electrodes $9a$ and $9b$ are each formed with a metal that is typically employed as a wiring electrode, such as Cu, Ag, or Al. The via conductors 10 are formed with a metal, such as Ag or Cu. For example, a metal member that protects the surface-layer conductor, such as a solder film, may be stacked on the surface-layer conductor that is connected to the shield wall 5.

The respective components $3a$ and $3b$ are configured of semiconductor elements formed with a semiconductor, such as Si or GaAs; and chip components, such as a chip inductor, a chip capacitor, and a chip resistor.

The sealing resin layer 4 is stacked on the wiring board 2 so as to cover the upper surface $20a$ of the wiring board 2 and the components $3a$ and $3b$. The sealing resin layer 4 can be formed with a resin that is typically employed as a sealing resin such as epoxy resin. Also, in this embodiment, a step is formed to define a higher portion and a lower portion at an upper surface 4a of the sealing resin layer 4, the upper surface 4a being a surface opposite to a surface of the sealing resin layer 4 that contacts the wiring board 2. The step is defined by a higher portion surface 4a1 and a lower portion surface 4a2 disposed substantially in parallel to one another, and a step surface 4a3 extending in a direction perpendicularly to the surfaces 4a1 and 4a2 and connecting both surfaces.

The shield wall 5 is formed with a conductor in the groove 11 formed in the upper surface 4a of the sealing resin layer 4. Specifically, as illustrated in FIGS. 1 and 2, a groove 11 is formed in the upper surface 4a of the sealing resin layer 4 so that the groove 11 intersects with the step of the sealing resin layer 4 and extends between the predetermined components 3a and 3b when the wiring board 2 is viewed in plan view. The shield wall 5 is formed by disposing the conductor in the groove 11. The groove 11 according to this embodiment, by the entire length thereof, extends through the sealing resin layer 4 in the thickness direction. The groove 11 is configured to allow the surface-layer conductor of the upper surface 20a of the wiring board 2 to be connected to the shield wall 5 in the groove 11. Also, an upper end portion of the shield wall 5 is electrically connected to a top surface of the shield film 6 (described later). The shield wall 5 can be formed, for example, by filling the groove 11 with a conductive paste containing a metal filler of one of Ag, Cu, and Al.

The shape of the cross section of the groove 11 in a direction perpendicular to the upper surface 20a of the wiring board 2 and in a direction intersecting with the groove 11 at the higher portion side of the step differs from the shape of the cross section of the groove 11 at the lower portion side of the step. Specifically, as illustrated in FIGS. 3A and 3B, the cross section of the groove 11 includes a first portion 11a at the upper surface 20a side of the wiring board 2, and a second portion 11b at the upper surface 4a side of the sealing resin layer 4, the second portion 11b being continuous from the first portion 11a. The first portion 11a and the second portion 11b, each has a shape that is expanded in a direction from a surface of the sealing resin layer 4 facing the wiring board 2 toward the upper surface 4a. Also, the maximum width of the first portion 11a is smaller than the maximum width of the second portion 11b in the cross section at either of the higher portion side and the lower portion side. Also, in this embodiment, regarding the second portion 11b of the groove 11, a width W1 at a height position of the upper surface 4a of the sealing resin layer 4 at the higher portion side of the step is substantially the same as a width W1 at the lower portion side of the groove; however, a length L1 in the depth direction of the groove 11 at the higher portion side of the step is larger than a length L2 in the direction at the lower portion side. Hence, the area at the higher portion side of the step is larger than the area at the lower portion side of the step.

The shield film 6 cuts the noises from the outside to the various wiring electrodes in the wiring board 2 and the components 3a and 3b. The shield film 6 is stacked on the sealing resin layer 4 so as to cover the upper surface 4a and peripheral side surfaces 4b of the sealing resin layer 4, and side surfaces 20b of the wiring board 2. The shield film 6 is connected to the wiring electrode 9a (ground electrode) exposed from the side surface 20b of the wiring board 2.

Also, the shield film 6 can be formed in a multilayer structure including a close-contact film stacked on a surface of the sealing resin layer 4, a conductive film stacked on the close-contact film, and a protection film stacked on the conductive film.

The close-contact film is provided to increase bonding strength between the conductive film and the sealing resin layer 4. For example, the close-contact film can be formed with a metal, such as SUS, Ti, Cr, Ni, or TiAl. The conductive film is a layer substantially having a shield function of the shield film 6. For example, the conductive film can be formed with a metal being one of Cu, Ag, and Al, or carbon (C). The protection film is provided to prevent the conductive film from being corroded or scratched. For example, the protection film can be formed with a metal, such as SUS, Ti, Cr, Ni, or TiAl.

(Method of Manufacturing High-Frequency Module)

A method of manufacturing the high-frequency module 1a is described next.

First, the wiring board 2, in which the mount electrodes 7 for mounting the components 3a and 3b, the surface-layer conductor that is connected to the shield wall 5, the various wiring electrodes 9a and 9b, and the via conductors 10 are formed, are prepared by a known method.

Then, the components 3a and 3b are mounted on the upper surface 20a of the wiring board 2, by using a known surface mount technology such as mounting with solder.

Then, the sealing resin layer 4 is stacked on the upper surface 20a of the wiring board 2 so as to cover the components 3a and 3b. Thus, a component sealed body is formed. At this time, the step is formed at the upper surface 4a of the sealing resin layer 4. Such a sealing resin layer 4 can be formed, for example, by transfer molding, compression molding, or the like.

Then, the groove 11 disposed in the sealing resin layer 4 at the position between the predetermined components 3a and 3b is formed with two-step laser irradiation. Specifically, in the first step, the upper surface 4a side of the sealing resin layer 4 is irradiated with laser light, and hence a portion corresponding to the second portion 11b of the groove 11 is formed. At this time, a groove (first groove) having a small depth to a certain extent that the upper surface 20a of the wiring board 2 is not exposed is formed. The depth of the groove is set so that the depth at the higher portion side (the depth L1 at the higher portion side) is larger than the depth at the lower portion side (the depth L2 at the lower portion side).

Then, in the second step, a bottom portion of the first groove is irradiated with laser light, hence the second groove extending through the sealing resin layer 4 is formed, and the groove 11 is completed. At this time, the width of the second groove is smaller than the width of the first groove (see the width W1 in FIGS. 3A and 3B). In this embodiment, for example, the maximum value of the width of the first portion 11a of the groove 11 is smaller than the minimum value of the width of the second portion 11b. If the groove 11 is formed with two-step laser irradiation as described above, formation accuracy of the width of the second groove can be increased. Also, if the formation accuracy of the width of the second groove is increased, the width of the groove can be decreased, and the mount area of the upper surface 20a of the wiring board 2 can be increased. In FIGS. 3A and 3B, the first portion 11a and the second portion 11b of the groove 11 are formed in tapered shapes whose widths are decreased toward the deep side. However, in this embodiment, the shapes of the first portion 11a and the second portion 11b of the groove are not limited to the shapes. Side surfaces of the first portion 11a and the second portion 11b may be perpendicular to the upper surface of the sealing resin layer 4, or may be curved.

Then, the shield wall 5 is formed by filling the groove 11 with a conductive paste containing a metal filler of, for example, Ag. At this time, since the area of the second portion 11b of the groove 11 at the higher portion side of the step is larger than the area of the second portion 11b of the groove 11 at the lower portion side, the staying amount of the conductive paste can be increased in a portion corresponding to the second portion 11b of the groove 11 at the higher portion side. Also, even when trench heights are different, the first portions, which have difficulty in being filled with the conductive paste, can have substantially the same heights, shapes, and groove widths. This configuration increases ease of filling the portion corresponding to the first portion 11a of the groove 11 at the higher portion side, the portion which originally has difficulty in being filled with the conductive paste.

Then, the shield film 6 that covers the upper surface 4a and peripheral side surfaces 4b of the sealing resin layer 4, and the side surfaces 20b of the wiring board 2 is formed by using a film forming technology, such as sputtering or vapor deposition, and thus the high-frequency module 1a is completed.

Hence, with the above-described embodiment, the area of the second portion 11b of the groove 11 at the higher portion side of the step is larger than the area of the second portion 11b at the lower portion side. With this configuration, the filling capacity for the conductive paste of the groove 11 at the higher portion side is increased as compared with that of the groove 11 at the lower portion side. Ease of filling the first portion 11a of the groove 11 at the higher portion side, the portion which has difficulty in being filled with the conductive paste, with the conductive paste can be increased.

Also, since the step is provided at the upper surface 4a of the sealing resin layer 4, the excessive portion of the sealing resin layer 4 can be decreased, for example, by disposing components 3a and 3b with large thicknesses at the higher portion side of the step of the sealing resin layer 4 and by disposing components 3a and 3b with small thicknesses at the lower portion side of the sealing resin layer 4 in the plurality of components 3a and 3b. Also, since the shield wall 5 is disposed to intersect with the step of the sealing resin layer 4, the degree of freedom of arrangement for the components 3a and 3b mounted on the upper surface 20a of the wiring board 2 can be increased.

Second Embodiment

Figure 4:
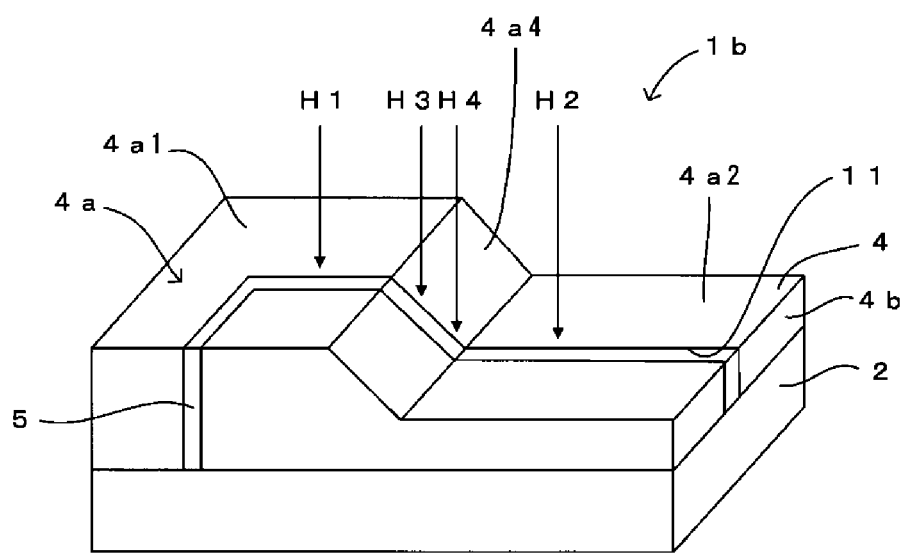
FIG. 4 is a perspective view of a high-frequency module according to a second embodiment of the present disclosure.
Figure 9:
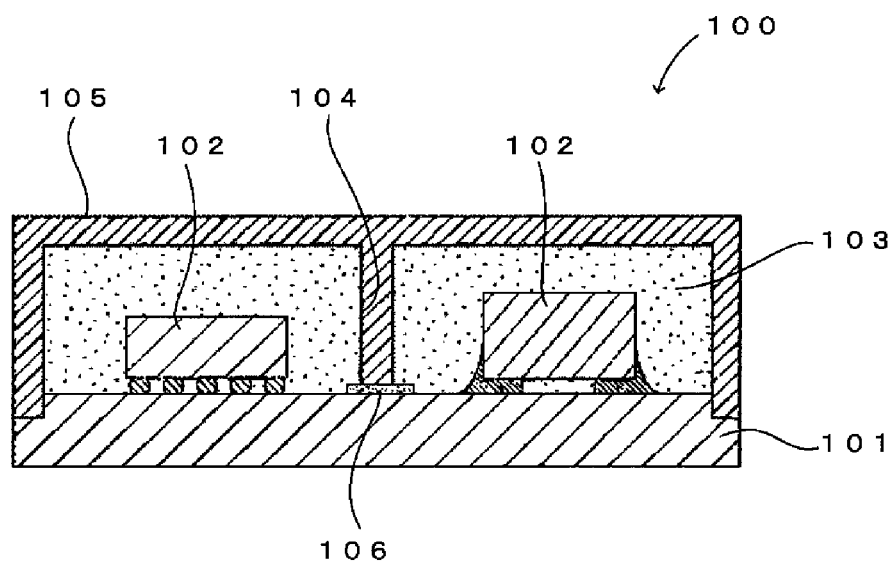
FIG. 9 is a sectional view of the high-frequency module of related art.

A high-frequency module according to a second embodiment of the present disclosure is described next with reference to FIGS. 4 and 5A-5D. FIG. 4 is a perspective view of the high-frequency module, and FIGS. 5A-5D are illustrations for explaining sectional shapes of a groove 11. FIG. 4 omits illustration of the shield film 6. FIG. 5A is a sectional view of the groove 11 at a height position of arrow H1 in FIG. 4. FIG. 5B is a sectional view of the groove 11 at a height position of arrow H3 in FIG. 4. FIG. 5C is a sectional view of the groove 11 at a height position of arrow H4 in FIG. 4. FIG. 5D is a sectional view of the groove 11 at a height position of arrow H2 in FIG. 4.

A high-frequency module 1b according to this embodiment differs from the high-frequency module 1a according to the first embodiment which has been described above with reference to FIGS. 1 to 3B in that a sealing resin layer 4 has a different step shape as illustrated in FIG. 4. The other configuration is similar to that of the high-frequency module 1a according to the first embodiment, and therefore the same reference sign is applied to the same component and the redundant description is omitted.

In this case, a step at an upper surface 4a of the sealing resin layer 4 is defined by a higher portion surface 4a1, a lower portion surface 4a2, and a step surface 4a4 inclined from a higher portion (higher portion surface 4a1) to a lower portion (lower portion surface 4a2). Also, a second portion 11b of the groove 11 has the same width W1 at any cross section (a width at a height position of the upper surface 4a) and a length in the depth direction of the groove 11, the length which is decreased from the higher portion side toward the lower portion side (L1>L3>L4>L2). Hence, regarding the groove 11 formed at the step surface 4a4, the area of the second portion 11b at any cross section is a value between the area of the second portion 11b of the groove 11 at the higher portion side and the area of the second portion 11b of the groove at the lower portion side. Also, as illustrated in FIGS. 5B and 5C, the area of the second portion 11b of the groove 11 of the step surface 4a4 is decreased from the higher portion side of the step toward the lower portion side.

With this configuration, even when the step has an inclined surface (step surface 4a4), the ease of filling with the conductive paste can be increased over the entire length of the groove 11. Also, for example, when the step of the sealing resin layer 4 is molded with a die, the sealing resin layer 4 is easily released from the die.

(Modifications of Groove)

Modifications of the groove 11 are described next with reference to FIGS. 6A to 8D. FIGS. 6A to 8D illustrate modifications of the sectional shape of the groove 11, and correspond to FIGS. 5A-5D.

The sectional shape of the groove 11 can be appropriately changed. For example, as illustrated in FIGS. 6A-6D, a groove 11 may be formed in a manner that the width at an upper end position of the first portion 11a of the groove 11 is the same as the width at a lower end position of the second portion 11b, and the expansion degree of the second portion of the groove 11 is larger than the expansion degree of the first portion.

Also, as illustrated in FIGS. 7A-7D, when the area of the second portion 11b of the groove 11 at the higher portion side is larger than the area of the second portion of the groove 11 at the lower portion side, the width of the second portion 11b at the position of the upper surface 4a of the sealing resin layer 4 may be changed while a length L5 in the depth direction of the groove 11 of the second portion 11b is not changed. In this case, a width W2 of the second portion 11b of the groove 11 at the lower portion side is set to be smaller than a width W1 of the second portion 11b of the groove 11 at the higher portion side. Also, regarding the groove 11 at the step surface 4a4, the width of the second portion 11b at any cross section is a value between the width W1 at the higher portion side and a width W2 at the lower portion side, and the width is decreased from the higher portion side toward the lower portion side (W1>W3>W4>W2).

Also, as illustrated in FIGS. 8A-8D, the two-portion structure including the first portion 11a and the second portion 11b of the groove 11 may be changed to a one-portion structure. In this case, the groove 11 has a sectional shape expanded from the upper surface 20a of the wiring board 2 toward the upper surface 4a of the sealing resin layer 4. Also, the expansion degree at the higher portion side of the step is larger than that at the lower portion side. Regarding the expansion degree of the groove 11 at the step surface 4a4, the expansion degree in any cross section is a value between the expansion degree at the higher portion side and the expansion degree at the lower portion side, and the expansion degree is decreased from the higher portion side toward the lower portion side. Accordingly, the width of the groove 11 at the height position of the upper surface 4a of the sealing resin layer 4 is larger at the higher portion side than the width of the groove 11 at the lower portion side (W1>W3>W4>W2). Also, the width of a portion of the groove 11 that contacts the upper surface 20a of the wiring board 2 can be constant at any height of the groove. The region of the wiring board 2 on which components can be mounted can be widely secured.

Even when the groove 11 has any one of the sectional shapes illustrated in FIGS. 6A to 8D, advantageous effects similar to those of the high-frequency module 1b according to the second embodiment can be obtained.

The present disclosure is not limited to the above-described embodiments, and can be modified in various ways other than the modifications described above, within the scope of the disclosure. For example, the sectional shape of the groove 11 according to the first embodiment may be any one of the sectional shapes illustrated in FIGS. 6A to 8D.

INDUSTRIAL APPLICABILITY

The present disclosure can be applied to various high-frequency modules, each including a sealing resin layer that covers a plurality of components mounted on a wiring board, and a shield wall for preventing interference of noises between the components.

REFERENCE SIGNS LIST 1a, 1b high-frequency module
2 wiring board
20a upper surface (principal surface)
3a, 3b component
4 sealing resin layer
4a upper surface (opposite surface)
5 shield wall
11 groove
11a first portion
11b second portion

The invention claimed is:

1. A high-frequency module comprising:
a wiring board;
a plurality of components mounted on a principal surface of the wiring board;
a sealing resin layer that is stacked on the principal surface of the wiring board, that has a step at an opposite surface of the sealing resin layer opposite to a surface of the sealing resin layer at a principal surface side of the wiring board, and that covers the plurality of components;
a groove that is formed in the sealing resin layer to intersect with the step when the wiring board is viewed in plan view, and that extends between a predetermined component and another component included in the plurality of components; and
a shield wall disposed in the groove and formed with a conductor,
wherein the groove includes, in a cross section taken in a direction perpendicular to the principal surface of the wiring board and in a direction intersecting with the groove, a first portion at the principal surface side of the wiring board, and a second portion at an opposite surface side of the sealing resin layer, the second portion being continuous from the first portion, and
wherein, in the cross section, an area of the second portion of the groove located at a higher portion side of the step is larger than an area of the second portion of the groove located at a lower portion side of the step.

2. The high-frequency module according to claim 1, wherein a length in a depth direction of the groove at the higher portion side of the step is larger than a length in the depth direction at the lower portion side, and the area of the second portion at the higher portion side of the step is larger than the area of the second portion at the lower portion side.

3. The high-frequency module according to claim 1, wherein a width at a height position of the opposite surface of the sealing resin layer at the higher portion side of the step is larger than a width at the height position at the lower portion side, and the area of the second portion at the higher portion side of the step is larger than the area of the second portion at the lower portion side.

4. The high-frequency module according to claim 1,
wherein the step has an inclined surface that connects the higher portion side with the lower portion side, and
wherein an area of the second portion at the inclined surface is equal to or smaller than the area at the higher portion side of the step and equal to or larger than the area at the lower portion side.

5. The high-frequency module according to claim 4, wherein the area of the second portion at the inclined surface is smaller than the higher portion side of the step toward the lower portion side.

6. A high-frequency module comprising:
a wiring board;
a plurality of components mounted on a principal surface of the wiring board;
a sealing resin layer that is stacked on the principal surface of the wiring board, that has a step at an opposite surface of the sealing resin layer opposite to a surface of the sealing resin layer at a principal surface side of the wiring board, and that covers the plurality of components;
a groove that is arranged in the sealing resin layer to intersect with the step when the wiring board is viewed in plan view, and that extends between a predetermined component and another component included in the plurality of components; and
a shield wall disposed in the groove and formed with a conductor,
wherein the groove has a sectional shape that is expanded from the surface of the sealing resin layer at the principal surface side of the wiring board toward the opposite surface of the sealing resin layer, and
wherein, an expansion degree of the sectional shape of the groove located at the higher portion side of the step is larger than an expansion degree of the sectional shape of the groove located at the lower portion side of the step.

7. The high-frequency module according to claim 2, wherein a width at a height position of the opposite surface of the sealing resin layer at the higher portion side of the step is larger than a width at the height position at the lower portion side, and the area of the second portion at the higher portion side of the step is larger than the area of the second portion at the lower portion side.

8. The high-frequency module according to claim 2, wherein the step has an inclined surface that connects the higher portion side with the lower portion side, and wherein an area of the second portion at the inclined surface is equal to or smaller than the area at the higher portion side of the step and equal to or larger than the area at the lower portion side.

9. The high-frequency module according to claim 3, wherein the step has an inclined surface that connects the higher portion side with the lower portion side, and wherein an area of the second portion at the inclined surface is equal to or smaller than the area at the higher portion side of the step and equal to or larger than the area at the lower portion side.

\* \* \* \* \*